(12) United States Patent
Waidhas et al.

(10) Patent No.: US 10,263,106 B2
(45) Date of Patent: Apr. 16, 2019

(54) POWER MESH-ON-DIE TRACE BUMPING

(71) Applicant: Intel IP Corporation, Santa Clara, CA (US)

(72) Inventors: Bernd Waidhas, Pettendorf (DE); Sonja Koller, Regensburg (DE); Georg Seidemann, Landshut (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/476,270

(22) Filed: Mar. 31, 2017

(65) Prior Publication Data

US 2018/0286798 A1  Oct. 4, 2018

(51) Int. Cl.
| | |
|---|---|
| *H01L 23/52* | (2006.01) |
| *H01L 21/82* | (2006.01) |
| *H01L 29/78* | (2006.01) |
| *H01L 23/00* | (2006.01) |
| *H01L 29/66* | (2006.01) |
| *H01L 23/498* | (2006.01) |
| *H01L 23/50* | (2006.01) |

(52) U.S. Cl.
CPC .... *H01L 29/7835* (2013.01); *H01L 23/49838* (2013.01); *H01L 23/50* (2013.01); *H01L 24/06* (2013.01); *H01L 29/66659* (2013.01)

(58) Field of Classification Search
CPC ..................... H01L 29/7835; H01L 29/66659
USPC ......... 438/128–129, 597–599; 257/207–208, 257/529–530
See application file for complete search history.

(56) References Cited

U.S. PATENT DOCUMENTS 7,739,624 B2 * 6/2010 McElvain ........... G06F 17/5077 703/13

* cited by examiner

*Primary Examiner* — Calvin Lee
(74) *Attorney, Agent, or Firm* — Schwegman Lundberg & Woessner, P.A.

(57) ABSTRACT

A power mesh-on-die apparatus includes a solder trace that enhances current flow for a power source trace between adjacent power bumps. The solder trace is also applied between power drain bumps on a power drain trace.

21 Claims, 8 Drawing Sheets

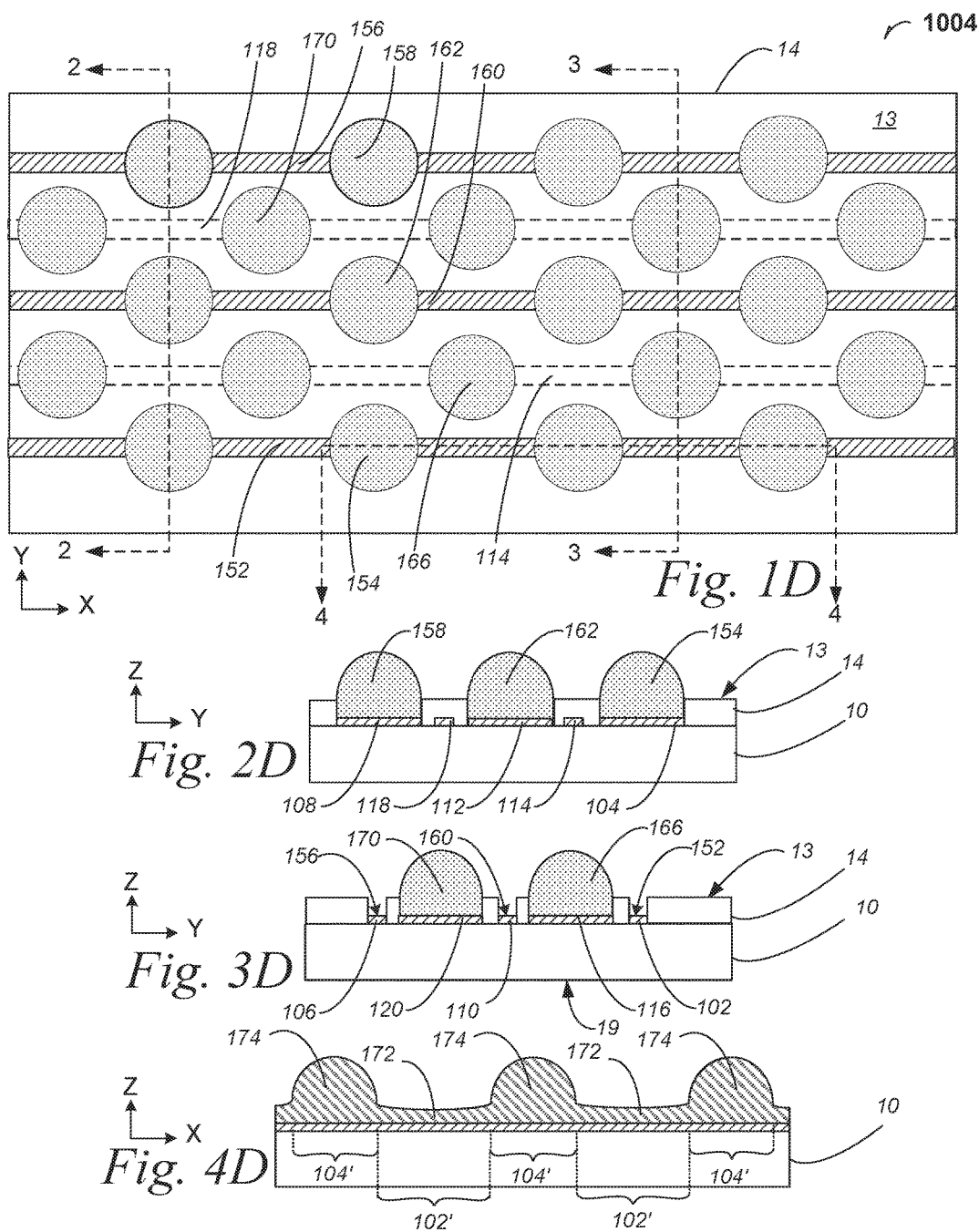

US 10,263,106 B2

POWER MESH-ON-DIE TRACE BUMPING

FIELD

This disclosure relates to mounting substrate technology that allows for high current in the face of miniaturization.

BACKGROUND

Package miniaturization pits smaller size against higher performance demands. Power- and ground wiring although also requiring miniaturization, also needs to carry sufficient current to meet the higher performance demands.

BRIEF DESCRIPTION OF THE DRAWINGS

Disclosed embodiments are illustrated by way of example, and not by way of limitation, in the figures of the accompanying drawings where like reference numerals may refer to similar elements, in which:

FIG. 1D is a top plan of the power mesh-on-die apparatus depicted in FIG. 1C after further processing according to an embodiment;

FIGS. 2D, 3D, and 4D are various cross-section elevations of the power mesh-on-die apparatus depicted in FIG. 1D. Additionally, FIG. 4D is a cross-section elevation of the power mesh-on-die apparatus depicted in FIG. 1D after further processing according to an embodiment;

DETAILED DESCRIPTION

Disclosed embodiments include power mesh-on-die bumping where a solder trace enhances electrical capacity for the power and ground meshes are accomplished with channeled solder between power or ground bumps.

Figure 1:
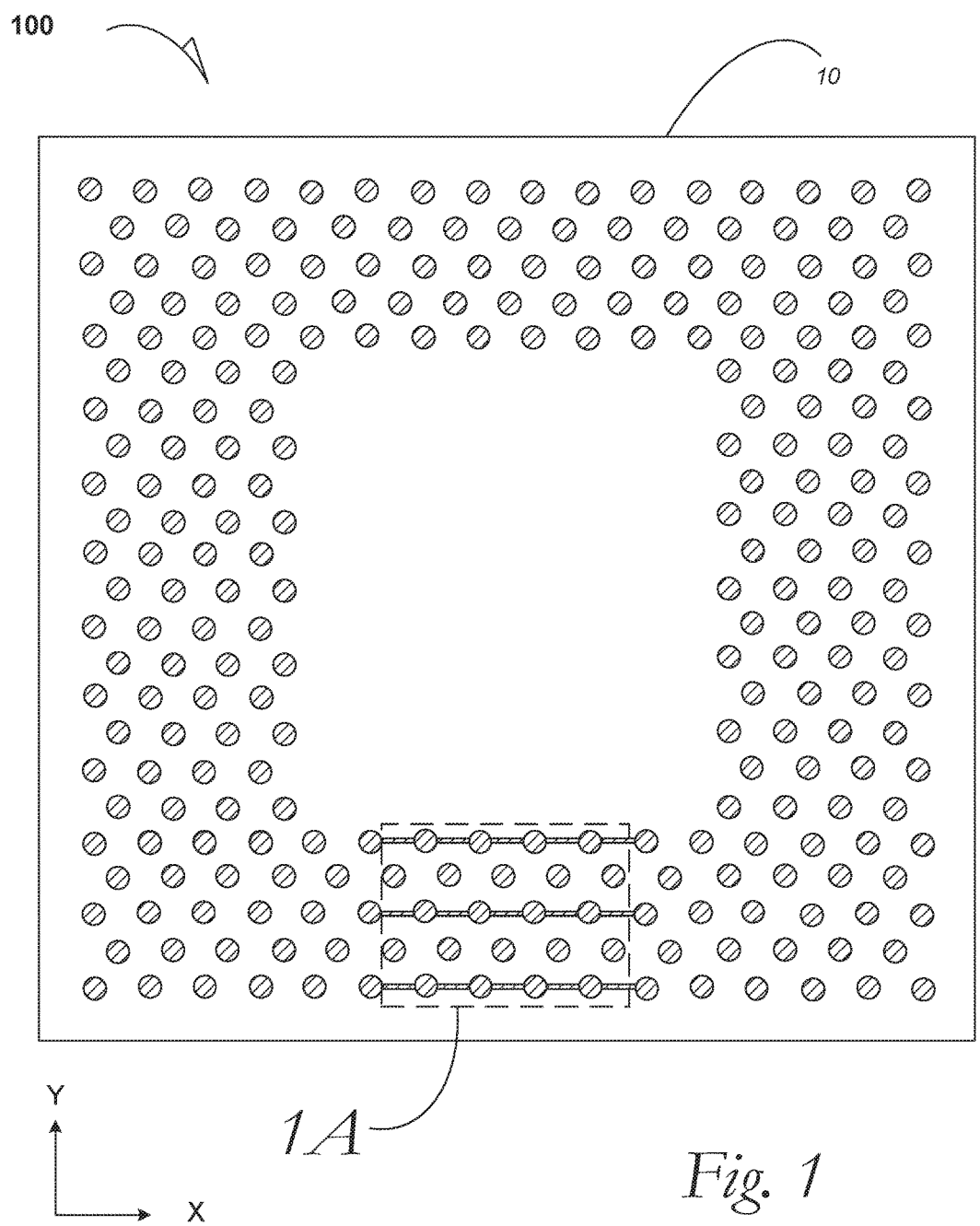
FIG. 1 is a top plan of a substrate that bears a power mesh-on-die apparatus according to an embodiment.

FIG. 1 is a top plan 100 of a substrate 10 that bears a power mesh-on-die apparatus IA according to an embodiment. The substrate 10 supports a ball array that contains a power mesh-on-die apparatus embodiment. More detailed embodiments are given in FIGS. 1A, 1B, 1C and 1D and pertinent accompanying figures.

Semiconductor package embodiments include wiring for power distribution as well as for signal distribution. Resistance within the power-distribution network is lowered and the related current-resistance (IR) drop is ameliorated under high-power conditions such that switching speeds and noise levels are managed to avoid functional failures. Disclosed embodiments lead to lower resistances and thus to better electrical performance by increasing the volume of wiring within the power and ground mesh wiring.

Where a semiconductor package requires solder connections, the solder mask is opened above the trace wiring such that a solder-enhanced trace is achieved locally between adjacent power solder bumps. Similarly, where the solder mask is opened above ground trace, a solder-enhanced ground trace between adjacent solder bumps.

Processing is accomplished by applying solder after opening a channel in the solder mask between, e.g. two adjacent power bumps. In an embodiment, application of the solder within the solder-mask channel between adjacent bumps is accomplished at the ball-apply technique. In an embodiment, application of the solder within the solder-mask channel between adjacent bumps is accomplished during a solder-bumping technique. In an embodiment, application of the solder within the solder-mask channel between adjacent bumps is accomplished at bump reflow where wetting of the solder bump allows the solder to flow by wicking action to form a solder trace between adjacent bumps along the trace that is exposed in the solder-mask channel. In an embodiment, conditions are achieved such that wicking of the solder is resisted by the solder mask but enhanced by the existing trace.

Figure 1A:
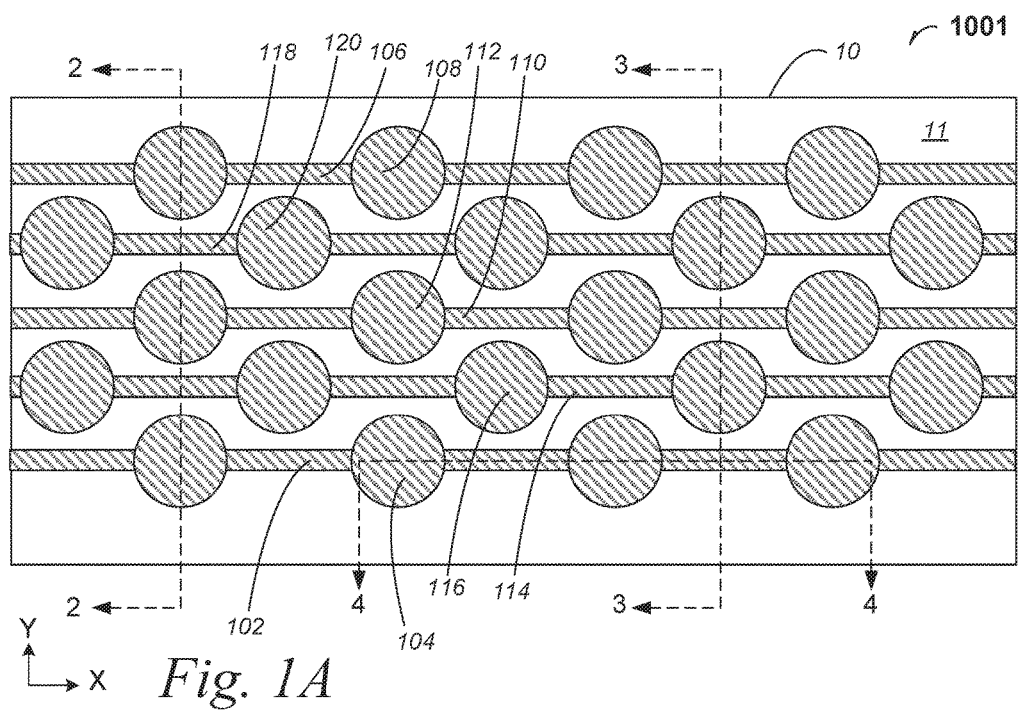
FIG. 1A is a top plan of a portion from a power mesh-on-die apparatus during processing according to an embodiment.

FIG. 1A is a top plan of a portion from a power mesh-on-die (power MOD) apparatus 1001 during processing according to an embodiment.

Although the term "power mesh-on-die" is used, it is understood that a substrate onto which the power mesh may be constructed, may be a substrate other than a semiconductive die. In an embodiment, the power MOD apparatus 1001 includes a portion of a mounting substrate 10 such as a motherboard and traces and bond pads are located on a substrate upper surface 11. In an embodiment, the power MOD apparatus 1001 includes a portion of a package substrate 10 for a processor die. In an embodiment, the power MOD apparatus 1001 includes a portion of a semiconductive device substrate 10 at the top metallization such as for a solder-on-die apparatus. In any event and unless explicitly expressed otherwise, the power MOD may be any disclosed substrate.

A first voltage-source source (first VSS) trace 102 is accompanied with a subsequent VSS trace 106 according to an embodiment. Other VSS traces may be used in a given power MOD apparatus. A first VSS bond pad 104 is one of several VSS bond pads, all of which are coupled in line (in the X-direction) with the first VSS trace 102. A subsequent VSS bond pad 108 is one of several VSS bond pads, all of which are coupled in line (in the X-direction) with the subsequent VSS trace 106. A first voltage-drain drain (first VDD) trace 110 is also located on the substrate 10. A first VDD bond pad 112 is one of several bond pads, all of which are coupled in line (in the X-direction) with the first VDD trace 110.

A first signal trace (signal-1 trace) 114 lies between the first VSS trace 102 and the first VDD trace 110 according to an embodiment. A signal-1 bond pad 116 is one of several signal-1 bond pads, all of which are coupled in line (in the X-direction) with the signal-1 trace 114. A second signal trace (signal-2 trace) 118 lies between the subsequent VSS trace 106 and the first VDD trace 110 according to an embodiment. A signal-2 bond pad 120 is one of several signal-2 bond pads, all of which are coupled in line (in the X-direction) with the signal-2 trace 118.

It is observed in an embodiment that the several bond pads are configured in a body-centered hexagonal (BCH) arrangement such that a total of seven bond pads are found with a hexagon of six bond pads being centered by a seventh bond pad. Other bond-pad arrangements may be used such as simple quadrilateral-packed bond pads. Other bond-pad arrangements may be used such as body-centered quadrilateral-packed bond pads with five bond pads. Other bond-pad arrangements may be used such as simple tetragonal-packed bond pads. Other bond-pad arrangements may be used such as body-centered tetragonal-packed bond pads with five bond pads.

Figure 2A:
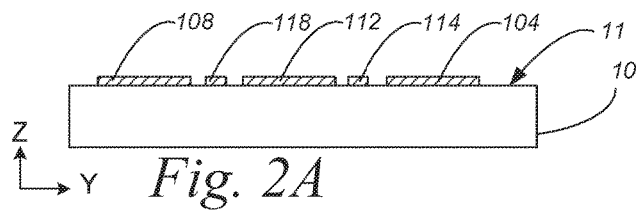
FIGS. 2A, 3A, and 4A are various cross-section elevations of the power mesh-on-die apparatus depicted in FIG. 1A.

FIG. 2A is a cross-section elevation of the power MOD apparatus 1001 depicted in FIG. 1A according to an embodiment. The cross section is taken from FIG. 1A along the section line 2-2. The substrate 10 is seen bearing on the upper surface 11, in order in the Y-direction from left to right, a subsequent VSS bond pad 108, the signal-2 trace 118 indicated in FIG. 1A, a first VDD bond pad 112, the signal-1 trace 114 indicated in FIG. 1A, and a first VSS bond pad 104.

Figure 3A:
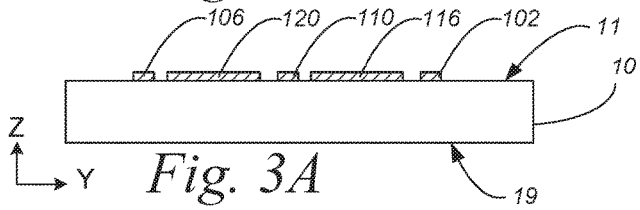

FIG. 3A is a cross-section elevation of the power MOD apparatus 1001 depicted in FIG. 1A according to an embodiment. The cross section is taken from FIG. 1A along the section line 3-3. The substrate 10 is seen bearing on the upper surface 11, in order in the Y-direction from left to right, the subsequent VSS trace 106 indicated in FIG. 1A, a signal-2 bond pad 120, the first VDD trace 110 indicated in FIG. 1A, a signal-1 bond pad 116, and the first VSS trace 102 indicated in FIG. 1A. In an embodiment, the upper surface 11 is opposite a lower surface 19. In an embodiment, the lower surface 19 provides sufficient electrical insulation to act as an outer shell 19 of a computing device. It may be understood that the outer shell 19 is disposed distant from the upper surface 11.

Figure 4A:
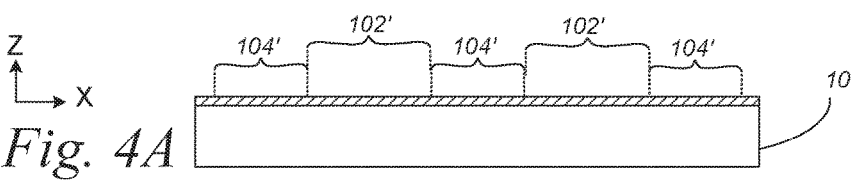

FIG. 4A is a cross-section elevation of the power MOD apparatus 1001 depicted in FIG. 1A according to an embodiment. The cross section is taken from FIG. 1A along the section line 4-4. The substrate 10 is seen bearing, in order in the X-direction from left to right, a footprint 104' (diagram left) covering a section of a first VSS bond pad 104, a footprint 102' covering a section of the first VSS trace 102, a footprint 104' (diagram center) covering a section of a first VSS bond pad 104, a footprint 102' covering a section of the first VSS trace 102, and a footprint 104' (diagram right) covering a section of a first VSS bond pad 104.

Figure 1B:
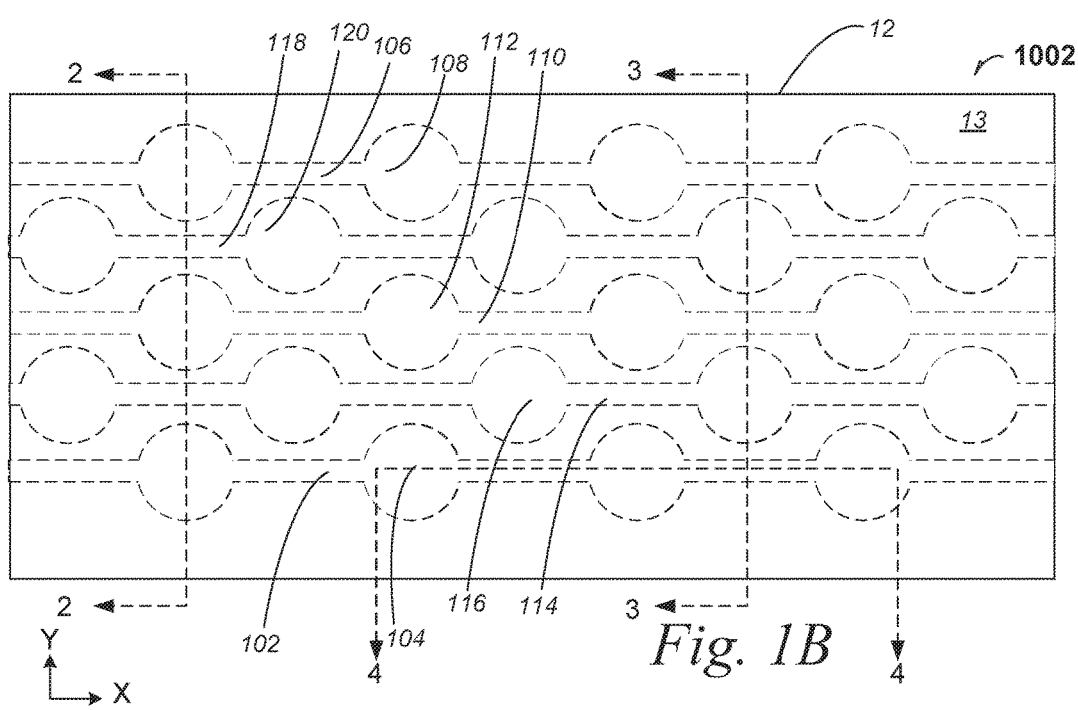
FIG. 1B is a top plan of the power mesh-on-die apparatus depicted in FIG. 1A after further processing according to an embodiment.

FIG. 1B is a top plan 1002 of the power MOD apparatus 1001 depicted in FIG. 1A after further processing according to an embodiment. The power MOD apparatus 1002 has been covered with a film such as a solder mask 12 in preparation for opening the solder mask 12 to received solder according to an embodiment. The solder mask 12 has a solder-mask upper surface 13.

The first VSS trace 102 and the subsequent VSS trace 106 are each depicted with dashed lines as each is hidden by the solder mask 12 according to an embodiment. Similarly, the first VSS bond pad 104 and the subsequent VSS bond pad 108 are each depicted in dashed lines as each is hidden by the solder mask 12. Similarly, the first VDD trace 110 is also depicted with dashed lines as it is hidden by the solder mask 12. Similarly, the first VDD bond pad 112 is depicted with dashed lines as it is hidden by the solder mask 12. Similarly, the signal-1 trace 114 is depicted with dashed lines as it is hidden by the solder mask 12. The signal-1 bond pad 116 is depicted with dashed lines as it is hidden by the solder mask 12. The signal-2 trace 118 is depicted with dashed lines as it is hidden by the solder mask 12. And the signal-2 bond pad 120 is depicted with dashed lines as it is hidden by the solder mask 12.

Figure 2B:
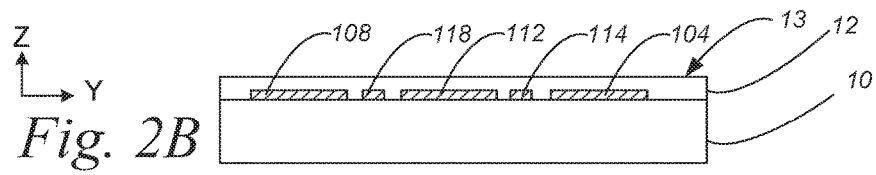
FIGS. 2B, 3B, and 4B are various cross-section elevations of the power mesh-on-die apparatus depicted in FIG. 1B.

FIG. 2B is a cross-section elevation of the power MOD apparatus 1002 depicted in FIG. 1B according to an embodiment. The cross section is taken from FIG. 1B along the section line 2-2. Beneath the solder-mask upper surface 13 is seen the substrate 10. The substrate 10 is seen bearing, in order in the Y-direction from left to right, a subsequent VSS bond pad 108, the signal-2 trace 118, a first VDD bond pad 112, the signal-1 trace 114, and a first VSS bond pad 104. Overlying the substrate 10 and the various traces and bonds pads is seen the solder mask 12. In an embodiment, the solder mask 12 is spun on, cured, and planarized to achieve the solder-mask upper surface 13.

Figure 3B:
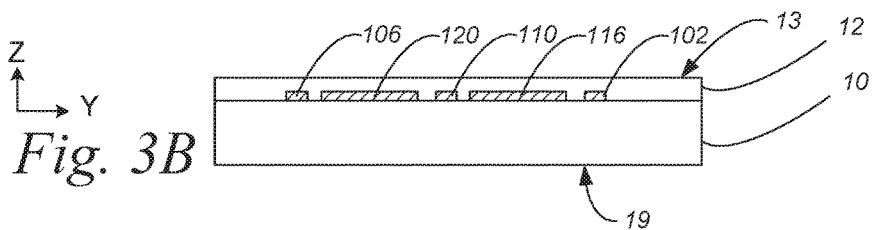

FIG. 3B is a cross-section elevation of the power MOD apparatus 102 depicted in FIG. 1B according to an embodiment. The cross section is taken from FIG. 1B along the section line 3-3. The substrate 10 is seen bearing, in order in the Y-direction from left to right, the subsequent VSS trace 106, a signal-2 bond pad 120, the first VDD trace 110, a signal-1 bond pad 116, and the first VSS trace 102. Overlying the substrate 10 and the various traces and bonds pads is seen the solder mask 12.

Figure 4B:
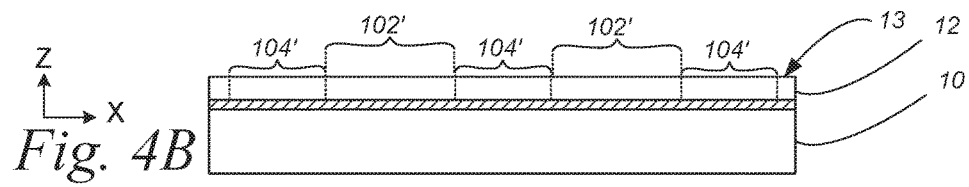

FIG. 4B is a cross-section elevation of the power MOD apparatus 102 depicted in FIG. 1B according to an embodiment. The cross section is taken from FIG. 1B along the section line 4-4. The substrate 10 is seen bearing, in order in the X-direction from left to right, a footprint 104' (diagram left) covering a section of the first VSS bond pad 104, a footprint 102' covering a section of the first VSS trace 102, a footprint 104' (diagram center) covering a section of a first VSS bond pad 104, a footprint 102' covering a section of the first VSS trace 102, and a footprint 104' (diagram right) covering a section of a first VSS bond pad 104. Overlying the substrate 10 and the various traces and bonds pads is seen the solder mask 12.

Figure 1C:
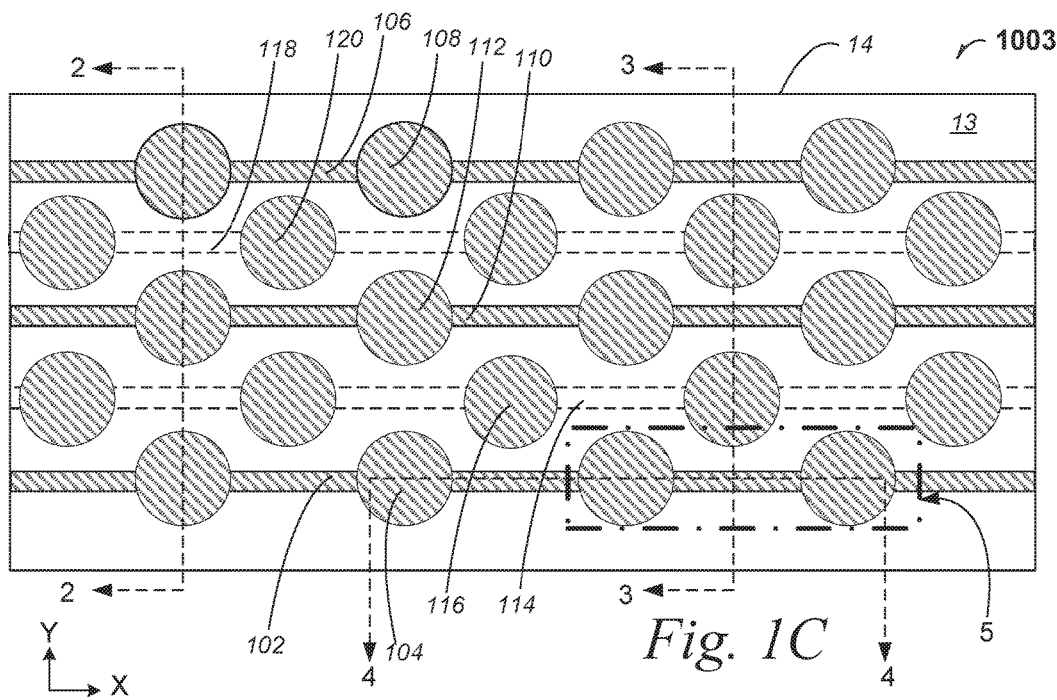
FIG. 1C is a top plan of the power mesh-on-die apparatus depicted in FIG. 1B after further processing according to an embodiment.

FIG. 1C is a top plan 1003 of the power MOD apparatus 1002 depicted in FIG. 1B after further processing according to an embodiment. The power MOD apparatus 1003 has been further processed by patterning the solder mask 12 (depicted in FIG. 1B) by opening into the solder-mask upper surface 13, to form a patterned mask 14 according to an embodiment.

The first VSS trace 102 is depicted through a channel section of the patterned mask 14 according to an embodiment. Similarly, the subsequent VSS trace 106 is also depicted through a channel section of the patterned mask 14 according to an embodiment. The first VSS bond pad 104 and the subsequent VSS bond pad 108 are depicted through open portions of the patterned mask 14. The first VDD trace 110 is depicted through a channel section of the patterned mask 14. Similarly, the first VDD bond pad 112 is depicted though an open portion of the patterned mask 14. The signal-1 trace 114 is depicted with dashed lines as it is hidden by the patterned mask 14. The signal-1 bond pad 116 is depicted through an open portion of the patterned mask 14. The signal-2 trace 118 is depicted with dashed lines as it is hidden by portions of the patterned mask 14. And the signal-2 bond pad 120 is depicted through an open portion of the patterned mask 14.

Figure 2C:
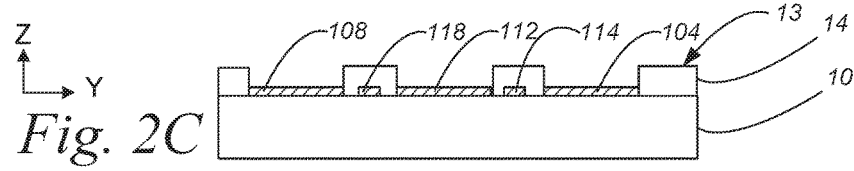
FIGS. 2C, 3C, and 4C are various cross-section elevations of the power mesh-on-die apparatus depicted in FIG. 1C.

FIG. 2C is a cross-section elevation of the power MOD apparatus 1003 depicted in FIG. 1C according to an embodiment. The cross section is taken from FIG. 1C along the section line 2-2. The substrate 10 is seen bearing, in order in the Y-direction from left to right, a subsequent VSS bond pad 108 (exposed through the patterned mask 14), the signal-2 trace 118 (covered by the patterned mask 14), the first VDD bond pad 112 (exposed through the patterned mask 14), the signal-1 trace 114 (covered by the patterned mask 14), and the first VSS bond pad 104 (exposed through the patterned mask 14).

Figure 3C:
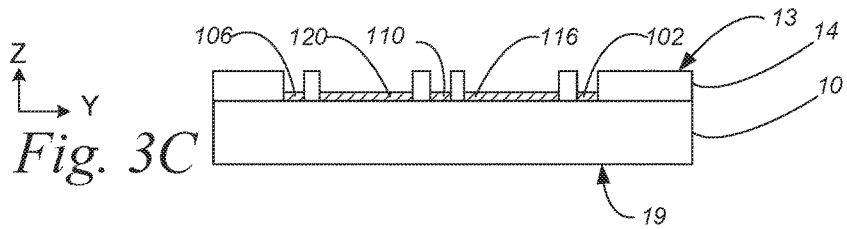

FIG. 3C is a cross-section elevation of the power MOD apparatus 1003 depicted in FIG. 1C according to an embodiment. The cross section is taken from FIG. 1C along the section line 3-3. The substrate 10 is seen bearing, in order in the Y-direction from left to right, the subsequent VSS trace 106, a signal-2 bond pad 120, the first VDD trace 110, a signal-1 bond pad 116, and the first VSS trace 102. Overlying the substrate 10 and the various traces and bonds pads is seen the patterned mask 14. It can be seen that the subsequent VSS trace 106 is disposed in a solder-mask channel that is formed in the patterned mask 14. Similarly, it can be seen that the first VDD trace 110 within this cross section is disposed in a solder-mask channel that is formed in the patterned mask 14. And similarly, it can be seen that the first VSS trace 102 within this cross section is disposed in a solder-mask channel that is formed in the patterned mask 14.

Figure 4C:
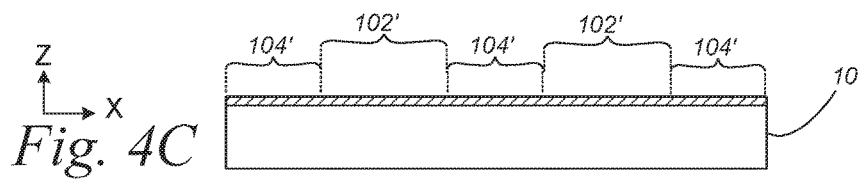

FIG. 4C is a cross-section elevation of the power MOD apparatus 1003 depicted in FIG. 1C according to an embodiment. The cross section is taken from FIG. 1C along the section line 4-4. The substrate 10 is seen bearing, in order in the X-direction from left to right, a footprint 104' (diagram left) covering a section of the first VSS bond pad 104, a footprint 102' covering a section of the first VSS trace 102, a footprint 104' (diagram center) covering a section of a VSS bond pad 104, a footprint 102' covering a section of the first VSS trace 102, and a footprint 104' (diagram right) covering a section of a first VSS bond pad 104. None of the patterned mask 14 is seen in FIG. 4C due to placement of the section line 4-4. Consequently, each of the trace-footprint sections 102' is located within the solder-mask channels that are formed by the patterned mask 14.

FIG. 1D is a top plan 1004 of the power MOD apparatus 1003 depicted in FIG. 1C after further processing according to an embodiment. The power MOD apparatus 1004 has been further processed by locating solder-bump precursors and solder-trace wicking areas through openings and solder-mask channels in the patterned mask 14 according to an embodiment.

A first VSS solder-trace wicking area 152 is depicted through a solder-mask channel in the patterned mask 14 according to an embodiment. The first VSS solder-trace wicking area 152 occupies the exposed portion of the first VSS trace 102 see FIG. 1A. Similarly, a subsequent VSS solder-trace wicking area 156 also occupies the exposed portion of subsequent VSS trace 106 depicted through a solder-mask channel in the patterned mask 14 according to an embodiment.

A first VSS solder-bump precursor 154 is disposed through an opening in the patterned mask 14 and on the first VSS bond pad 104 (obscured) according to an embodiment. And a subsequent VSS solder-bump precursor 158 is disposed through an opening in the patterned mask 14 and on the subsequent VSS bond pad 108 (obscured) according to an embodiment. A first VDD solder-trace wicking area 160 occupies the exposed portion of the first VDD trace 110 that is seen in a solder-mask channel of the patterned mask 14 see FIG. 1A. Similarly, a first VDD solder-bump precursor 162 is disposed above and on the first VDD bond pad 112 (obscured) though an opening in the patterned mask 14.

The signal-1 trace 114 is depicted with dashed lines as it is hidden by the patterned mask 14. A signal-1 solder-bump precursor 166 is disposed in an opening in the patterned mask 14 and it is disposed above and on the signal-1 bond pad 116 (obscured). The signal-2 trace 118 is depicted with dashed lines as it is hidden by portions of the patterned mask 14. And a signal-2 solder-bump precursor 170 is disposed in a solder-mask channel in the patterned mask 14 and it is above and on the signal-2 bond pad 120 (obscured).

FIG. 2D is a cross-section elevation of the power MOD apparatus 1004 depicted in FIG. 1D according to an embodiment. The cross section is taken from FIG. 1D along the section line 2-2. The substrate 10 is seen bearing, in order in the Y-direction from left to right, a subsequent VSS bond pad 108 superposed with the subsequent VSS solder-bump precursor 158. Next, the signal-2 trace 118 is covered by the patterned mask 14. Next, the first VDD bond pad 112 is superposed with the first VDD solder-bump precursor 162. Next, the signal-1 trace 114 is covered by the patterned mask 14. And lastly, the first VSS bond pad 104 is superposed with the first VSS bond-pad precursor 154. It can be seen that each of the solder-bump precursors 158, 162, and 154 extend above the upper surface 13 of the patterned mask 14 according to an embodiment.

FIG. 3D is a cross-section elevation of the power MOD apparatus 1004 depicted in FIG. 1D according to an embodiment. The cross section is taken from FIG. 1D along the section line 3-3. The substrate 10 is seen bearing, in order in the Y-direction from left to right, the subsequent VSS trace 106, exposes the subsequent VSS solder-trace wicking area 156. It is seen that the subsequent VSS trace 106 is within a solder-mask channel, as well as a portion of the subsequent VSS solder-trace wicking area 156, that is within the solder-mask channel. Next, a signal-2 bond pad 120 is superposed with a signal-2 solder-bump precursor 170 and the solder-bump precursor 170 extends above the patterned-mask upper surface 13. Next, the first VDD trace 110 exposes the first VDD solder-trace wicking area 160. Next, the signal-1 bond pad 116 is superposed with the signal-1 solder-bump precursor 166. Lastly, the first VSS trace 102 exposes the first VSS solder-trace wicking area 152. Overlying the substrate 10 and the various traces and bonds pads is seen the patterned mask 14. It can be seen that each of the solder-bump precursors 166 and 170 extend above the upper surface 13 of the patterned mask 14 according to an embodiment.

Processing is accomplished by applying solder after opening a channel in the solder mask between, e.g. two adjacent power bumps. In an embodiment, application of the solder precursor within the solder-mask channel between adjacent bumps is accomplished at the ball-apply technique. In an embodiment, application of the solder within the solder-mask channel between adjacent bumps is accomplished during a solder-bumping technique.

In an embodiment, application of the solder within the solder-mask channel between adjacent bumps is accomplished at bump reflow where wetting of the solder bump allows the solder to flow and form a solder trace between adjacent bumps along the trace that is exposed in the solder-mask channel. Further illustration and discussion of reflowed solder bridging within solder-mask channels is illustrated in FIG. 4D.

FIG. 4D is a cross-section elevation of the power MOD apparatus 1004 depicted in FIG. 1D according to an embodiment and after further processing. The cross section is taken from FIG. 1D along the section line 4-4 and after further processing. The substrate 10 is seen bearing, in order in the X-direction from left to right, a first VSS bond pad footprint 104', superposed with a first VSS solder bump 174 (diagram left and reflowed from a first VSS solder-bump precursor 154). Next, a first VSS trace footprint 102', superposed with a reflowed first VSS solder trace 172 (diagram second from left and reflowed from a first VSS solder bump precursor 154). Next, a first VSS bond pad footprint 104', superposed with a first VSS solder bump 174 (diagram center and reflowed from a first VSS solder-bump precursor 154). Next, a first VSS trace footprint 102', superposed with a reflowed first VSS solder trace 172 (diagram second from right and reflowed from a first VSS solder bump precursor 154). And lastly, a first VSS bond pad footprint 104', superposed with a first VSS solder bump 174 (diagram right and reflowed from a first VSS solder-bump precursor 154).

As can be understood in connection with the illustrations, the solder mask is opened with channels above the trace wiring and e.g. a tin-containing solder trace is applied (e.g. the trace 102 and the reflowed first VSS solder trace 172). The solder-mask lithography is modified to include the selected solder-mask channels at selected power and ground positions where a lowered resistance is useful.

As can be understood in connection with the illustrations, an integral solder structure exists within a solder channel of the first VSS solder trace 172 and the adjacent two first VSS solder bumps 174. Consequently, electrical resistance is lowered between bumps due to the integral solder structure as well as current able to flow in a given trace between adjacent solder bumps.

In an embodiment, solder may be deposited by placing solder balls that have sufficient volume and reflow qualities that wetting onto the traces exposed in the solder-mask channels is sufficient to achieve the enhanced-trace structure illustrated generally in FIG. 4D. In an embodiment, solder bumps and enhanced solder traces are built up starting from a seed layer, followed by electro plating through a plating resist that facilitates the solder-enhanced trace formation, followed by removing the plating resist.

In an embodiment, a tin-containing coating of the exposed traces is deposited onto the solder-trace wicking areas by a separate process. The tin-containing coating resists corrosion as the electronegativity of the trace is lower than the electronegativity of the solder-enhanced trace. As a lowered overall resistance is achieved, high-current operation of the power MOD apparatus protects the original trace while also accommodating more current in the solder trace.

To lower overall resistance, a lineal (along the entire length between bumps) coupling of the original trace and the solder-enhanced trace is accomplished. It may now be understood that "lineal contact" or "lineally superposed" means along the length of a given trace, a material is contacting the trace between the bumps that define the trace length. For example, the reflowed first VSS solder trace 172 is in lineal contact along the entire length of the first VSS trace 102 at the footprint 102' for any given first VSS trace 102. In any event, lowered overall resistance in useful power and ground sections of mesh-on-die bumping is achieved without increase of X-Y wiring dimensions.

Referring to FIGS. 1D and 2D, it is noted that the patterned mask 14 is in lineal contact with the signal-1 trace 114, in the X-direction in FIG. 1D, as well as orthogonal to the plane of the figure in FIG. 2D. Similarly, it is noted the patterned mask 14 is in lineal contact with the signal-2 trace 118, in the X-direction in FIG. 1D, as well as orthogonal to the plane of the figure in FIG. 2D.

In an embodiment, the nominal volume of e.g., a given VSS trace is compared to the nominal volume of the VSS solder trace that is superposed on the original VSS trace. In an embodiment, the nominal volume of the first VSS solder trace 172 is less than that of the nominal volume of the original first VSS trace footprint 102'. In an embodiment, the nominal volume of the first VSS solder trace 172 is about equal to that (within 1 percent) of the nominal volume of the original first VSS trace footprint 102'. In an embodiment, the nominal volume of the first VSS solder trace 172 is between about 1 percent and about double that of the nominal volume of the original first VSS trace footprint 102'. In an embodiment, the nominal volume of the first VSS solder trace 172 is about five times that of the nominal volume of the original first VSS trace footprint 102'.

Control of the nominal volume ratio may be achieved by the height of the patterned mask 14 above the Z-direction thickness of a given trace. For example, where nominal volumes are about 5:1 in favor of the solder trace and the height of the original trace is unity, the patterned mask 14 will have a comparative Z-direction height starting from the substrate upper surface 11, of about 6:1.

In an embodiment, measurement of nominal volume ratios is taken where the solder trace is at its smallest cross-sectional volume. As illustrate in FIG. 4D, a neck narrowing is seen in the first VSS solder trace 172 approximately where the reference line 172 touches the first VSS solder trace 172.

Figure 5:
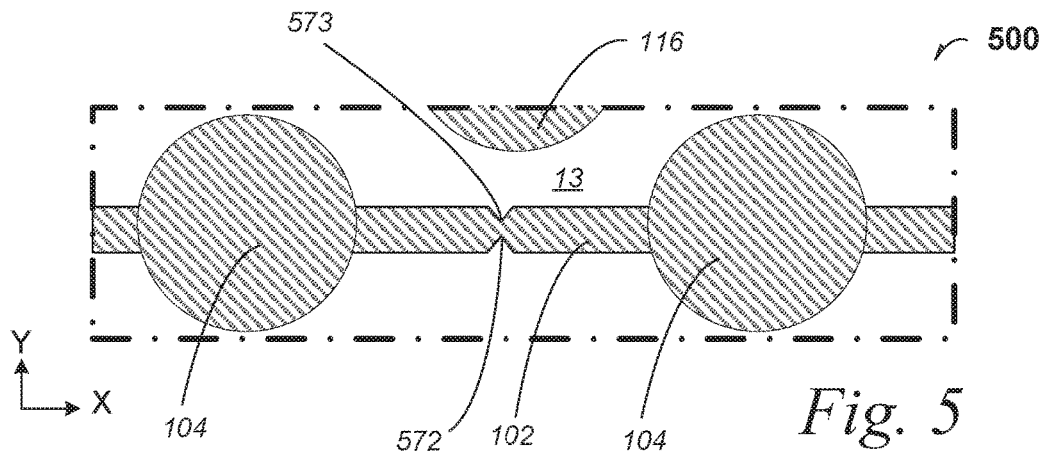
FIG. 5 is a detail section taken from FIG. 1C within the section line 5 according to an embodiment.

FIG. 5 is a detail section 500 taken from FIG. 1C within the section line 5 according to an embodiment. In an embodiment, a technique to achieve a solder trace is to reflow solder bumps where traces are superposed with solder by wicking action during solder-bump reflow. While some of the solder-bump precursor is drawn onto the exposed trace, the wicking action may continue until bridging is accomplished between, e.g., two VSS solder bumps to create the reflowed first VSS solder trace 172. The illustrated view reveals the patterned-mask upper surface 13 and first VSS bond pads 104 and a first VSS trace 102 according to an embodiment.

In an embodiment, wicking of solder along the exposed portion of a trace is controlled by a first centralized trace infarction 572 that narrows the first VSS trace 102 to restrain wicking action. In an embodiment, a second centralized trace infarction 573 is located opposite the first centralized trace infarction 572.

Figure 6:
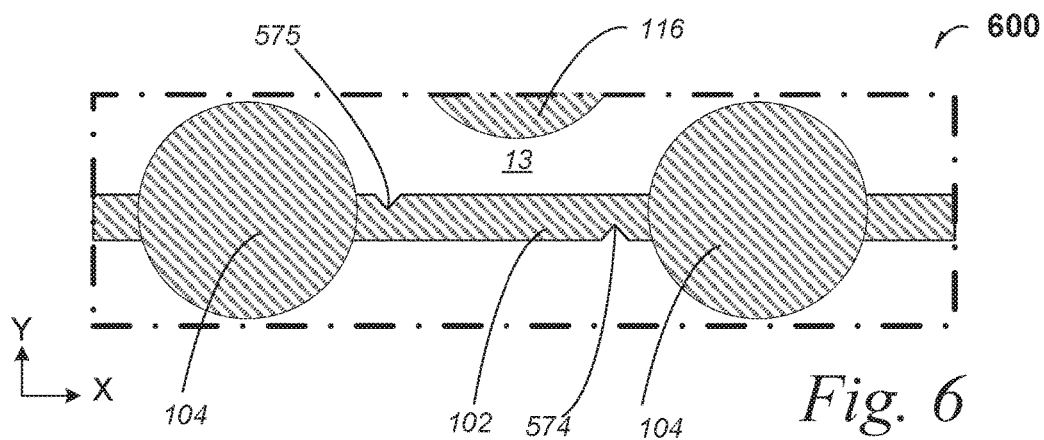
FIG. 6 is a detail section taken from FIG. 1C within the section line 5 according to an embodiment.

FIG. 6 is a detail section 600 taken from FIG. 1C within the section line 5 according to an embodiment. The illustrated view reveals the patterned-mask upper surface 13 and first VSS bond pads 104 and a first VSS trace 102 according to an embodiment.

In an embodiment, wicking of solder along a trace is controlled by a first lateralized trace infarction 574 that narrows the first VSS trace 102 to restrain wicking action. In an embodiment, a second lateralized trace infarction 575 is located opposite the first lateralized trace infarction 574. In an embodiment, a given lateralized trace infarction is closer to a bond pad than to the central region between two bond pads. For example, the first lateralized trace infarction 574 is closer to the first VSS bond pad 104, figure left, than to the first VSS bond pad 104, figure right.

Figure 7:
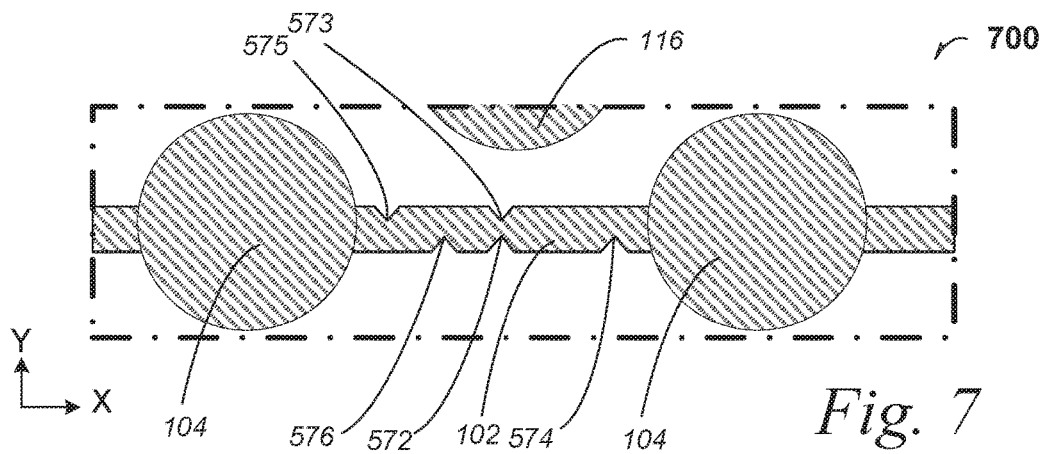
FIG. 7 is a detail section taken from FIG. 1C within the section line 5 according to an embodiment.

FIG. 7 is a detail section 700 taken from FIG. 1C within the section line 5 according to an embodiment. The illustrated view reveals the patterned-mask upper surface 13 and first VSS bond pads 104 and a first VSS trace 102 according to an embodiment.

In an embodiment, wicking of solder along a trace is controlled at least by an asymmetrical deployment of at least one trace infarction. As illustrated beside the trace infarctions 572, 573, 574, and 575, a trace infarction 576 creates an asymmetry of trace infarctions on the first VSS trace 102 on one side of the trace 102. In an embodiment, the number of trace infarctions is only one. In an embodiment, the number of trace infarctions is two, but they are deployed on the same side of a given trace. In an embodiment, the number of trace infarctions is an even number, but more trace infarctions are deployed on a given first side of the trace than on the given second side. In an embodiment, the number of trace infarctions is an odd number, but more trace infarctions are deployed on a given first side of the trace than on the given second side.

Figure 8:
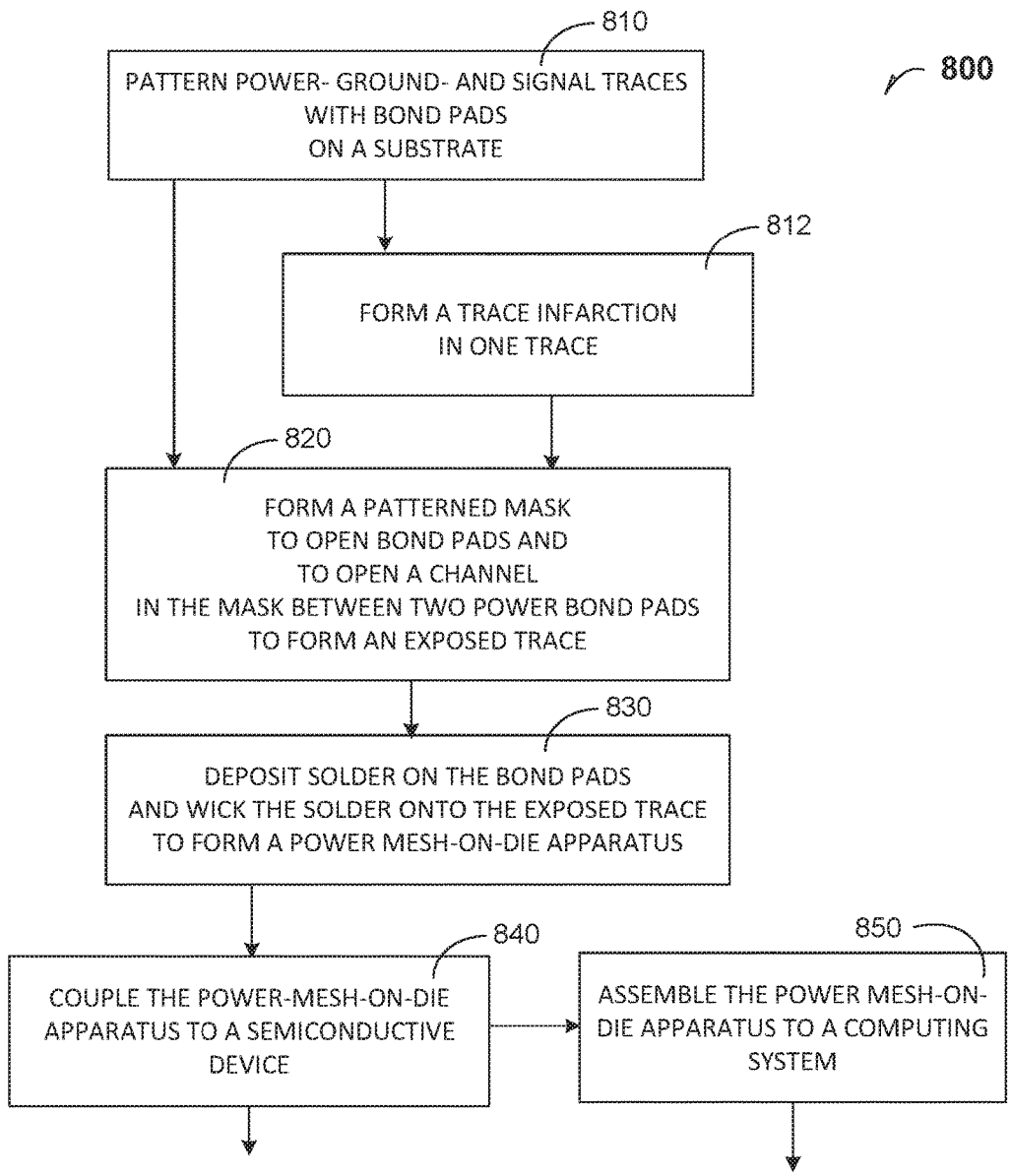
FIG. 8 is a process flow diagram that illustrates assembly of a power mesh-on-die apparatus according to an embodiment.

FIG. 8 is a process flow diagram 800 that illustrates assembly of a power mesh-on-die apparatus according to an embodiment.

At 810, the process includes patterning power-ground- and signal traces along with bond pads on an upper surface of a substrate.

At 812, the process includes forming a trace infarction in one trace.

At 820, the process includes forming a patterned mask to create bond pad openings and to open a channel between two power bond pads to form an exposed trace.

At 830, the process includes depositing solder on the bond pads and wick some solder into the channel and onto the exposed trace to form a power mesh-on-die apparatus.

At 840, the process includes coupling the power mesh-on-die apparatus to a semiconductive device.

At 850, the process includes assembling the power mesh-on-die apparatus to a computing system.

Figure 9:
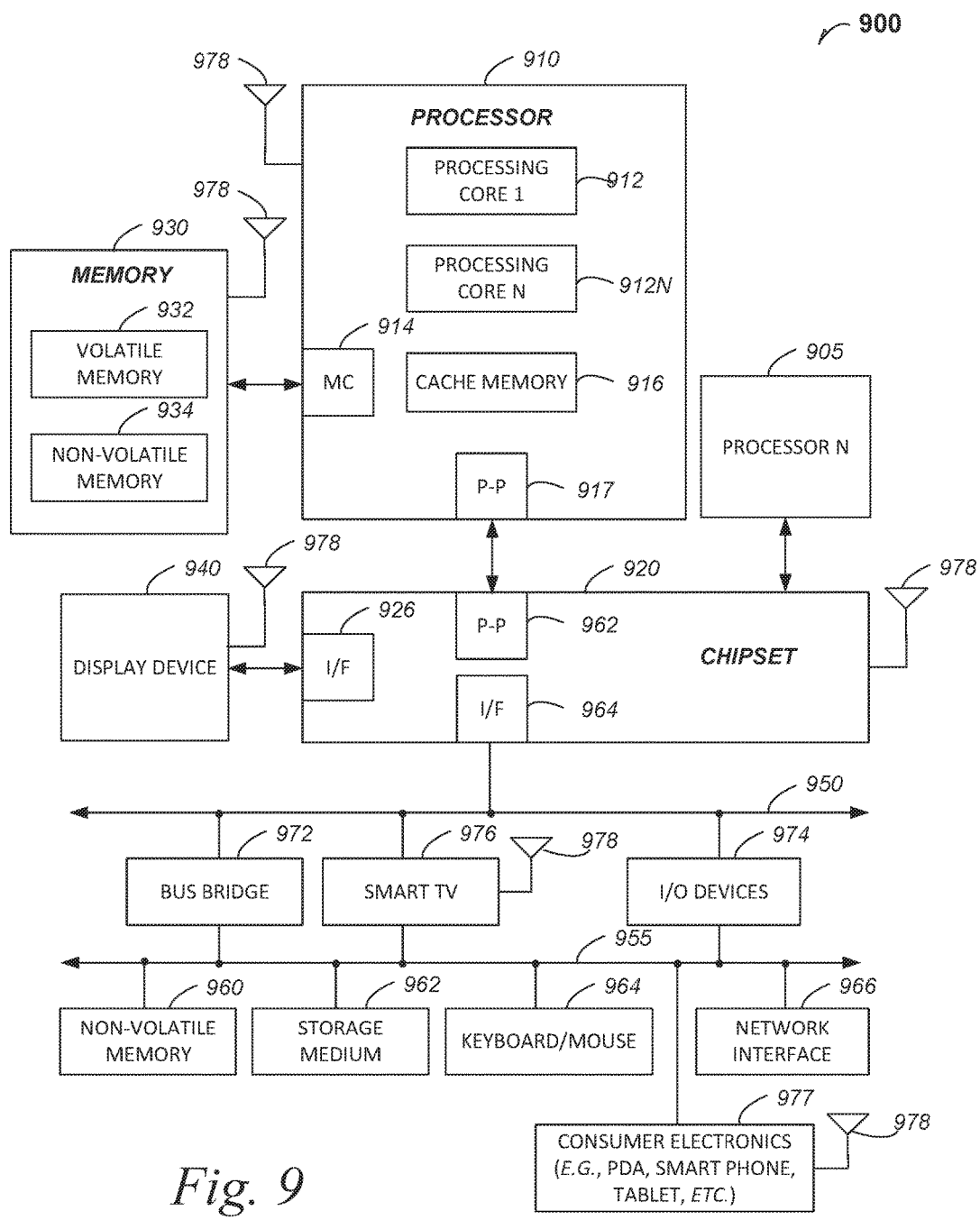
FIG. 9 is included to show an example of a higher level device application for the disclosed embodiments.

FIG. 9 is included to show an example of a higher level device application for the disclosed embodiments. In an embodiment, a computing system 900 includes, but is not limited to, a desktop computer. In an embodiment, a system 900 includes, but is not limited to a laptop computer. In an embodiment, a system 900 includes, but is not limited to a netbook. In an embodiment, a system 900 includes, but is not limited to a tablet. In an embodiment, a system 900 includes, but is not limited to a notebook computer. In an embodiment, a system 900 includes, but is not limited to a personal digital assistant (PDA). In an embodiment, a system 900 includes, but is not limited to a server. In an embodiment, a system 900 includes, but is not limited to a workstation. In an embodiment, a system 900 includes, but is not limited to a cellular telephone. In an embodiment, a system 900 includes, but is not limited to a mobile computing device. In an embodiment, a system 900 includes, but is not limited to a smart phone. In an embodiment, a system 900 includes, but is not limited to an internet appliance. Other types of computing device may be configured with the microelectronic device that includes a power mesh-on-die apparatus embodiment.

In an embodiment, the processor 910 has one or more processing cores 912 and 912N, where 912N represents the Nth processor core inside processor 910 where N is a positive integer. In an embodiment, the electronic device system 900 using a power mesh-on-die embodiment that includes multiple processors including 910 and 905, where the processor 905 has logic similar or identical to the logic of the processor 910. In an embodiment, the processing core 912 includes, but is not limited to, pre-fetch logic to fetch instructions, decode logic to decode the instructions, execution logic to execute instructions and the like. In an embodiment, the processor 910 has a cache memory 916 to cache at least one of instructions and data for the power mesh-on-die apparatus in the system 900. The cache memory 916 may be organized into a hierarchal structure including one or more levels of cache memory.

In an embodiment, the processor 910 includes a memory controller 914, which is operable to perform functions that enable the processor 910 to access and communicate with memory 930 that includes at least one of a volatile memory 932 and a non-volatile memory 934. In an embodiment, the processor 910 is coupled with memory 930 and chipset 920. The processor 910 may also be coupled to a wireless antenna 978 to communicate with any device configured to at least one of transmit and receive wireless signals. In an embodiment, the wireless antenna interface 978 operates in accordance with, but is not limited to, the IEEE 802.11 standard and its related family, Home Plug AV (HPAV), Ultra Wide Band (UWB), Bluetooth, WiMax, or any form of wireless communication protocol.

In an embodiment, the volatile memory 932 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 934 includes, but is not limited to, flash memory, phase change memory (PCM), read-only memory (ROM), electrically erasable programmable read-only memory (EEPROM), or any other type of non-volatile memory device.

The memory 930 stores information and instructions to be executed by the processor 910. In an embodiment, the memory 930 may also store temporary variables or other intermediate information while the processor 910 is executing instructions. In the illustrated embodiment, the chipset 920 connects with processor 910 via Point-to-Point (PtP or P-P) interfaces 917 and 922. Either of these PtP embodiments may be achieved using a power mesh-on-die embodiment as set forth in this disclosure. The chipset 920 enables the processor 910 to connect to other elements in the power mesh-on-die apparatus in a system 900. In an embodiment, interfaces 917 and 922 operate in accordance with a PtP communication protocol such as the Intel® QuickPath Interconnect (QPI) or the like. In other embodiments, a different interconnect may be used.

In an embodiment, the chipset 920 is operable to communicate with the processor 910, 905N, the display device 940, and other devices 972, 976, 974, 960, 962, 964, 966, 977, etc. The chipset 920 may also be coupled to a wireless antenna 978 to communicate with any device configured to at least do one of transmit and receive wireless signals.

The chipset 920 connects to the display device 940 via the interface 926. The display 940 may be, for example, a liquid crystal display (LCD), a plasma display, cathode ray tube (CRT) display, or any other form of visual display device. In and embodiment, the processor 910 and the chipset 920 are merged into a single power mesh-on-die apparatus in a system. Additionally, the chipset 920 connects to one or more buses 950 and 955 that interconnect various elements 974, 960, 962, 964, and 966. Buses 950 and 955 may be interconnected together via a bus bridge 972 such as at least one power mesh-on-die embodiment. In an embodiment, the chipset 920 couples with a non-volatile memory 960, a mass storage device(s) 962, a keyboard/mouse 964, and a network interface 966 by way of at least one of the interface 924 and 974, the smart TV 976, and the consumer electronics 977, etc.

In and embodiment, the mass storage device 962 includes, but is not limited to, a solid state drive, a hard disk drive, a universal serial bus flash memory drive, or any other form of computer data storage medium. In one embodiment, network interface 966 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 9 are depicted as separate blocks within the power mesh-on-die apparatus in a computing system 900, the functions performed by some of these blocks may be integrated within a single semiconductor circuit or may be implemented using two or more separate integrated circuits. For example, although cache memory 916 is depicted as a separate block within processor 910, cache memory 916 (or selected aspects of 916) can be incorporated into the processor core 912.

Where useful, the computing system 900 may have an outer shell such as the outer shell 19 depicted in FIG. 3A. In an embodiment, an outer shell is an electrically insulated structure that also provides physical protection for the power mesh-on-die apparatus.

To illustrate the power mesh-on-die apparatus embodiments and methods disclosed herein, a non-limiting list of examples is provided herein:

Example 1 is a power mesh-on-die apparatus comprising: a substrate including an upper surface; a voltage source source (VSS) trace disposed on the upper surface and between two VSS bond pads; and a VSS solder trace disposed between the two VSS bond pads and lineally superposed on the VSS trace.

In Example 2, the subject matter of Example 1 optionally includes a patterned mask disposed on the substrate upper surface, wherein the VSS solder trace is disposed in a channel in the patterned mask.

In Example 3, the subject matter of Example 2 optionally includes wherein each of the two VSS bond pads support a VSS solder bump, and wherein the VSS solder trace and the two VSS solder bumps are an integral solder structure.

In Example 4, the subject matter of any one or more of Examples 2-3 optionally include an infarction in the VSS trace.

In Example 5, the subject matter of any one or more of Examples 1-4 optionally include wherein the VSS trace is a first VSS trace, the solder trace is a first VSS solder trace, further including: a subsequent VSS trace disposed on the upper surface and between two VSS bond pads; a subsequent VSS solder trace disposed on the subsequent VSS trace and lineally superposed on the first VSS trace.

In Example 6, the subject matter of Example 5 optionally includes a patterned mask disposed on the substrate upper surface, wherein the VSS solder trace is a first VSS solder trace disposed in a channel in the patterned mask; and wherein the subsequent VSS solder trace is disposed in a subsequent channel in the patterned mask.

In Example 7, the subject matter of any one or more of Examples 1-6 optionally include wherein the VSS trace is a first VSS trace, the solder trace is a first VSS solder trace, further including: a voltage drain drain (VDD) trace disposed between two VDD bond pads; a VDD solder trace disposed on the VDD trace and lineally superposed on the VDD trace; a subsequent VSS trace disposed on the upper surface and between two VSS bond pads, wherein the first VSS trace and the subsequent VSS trace are spaced apart by the VDD trace; and a subsequent VSS solder trace disposed on the subsequent VSS trace and lineally superposed on the subsequent VSS trace.

In Example 8, the subject matter of Example 7 optionally includes a patterned mask disposed on the substrate upper surface, wherein the VSS solder trace is a first VSS solder trace disposed in a first channel in the patterned mask; wherein the subsequent VSS solder trace is disposed in a subsequent channel in the patterned mask; and wherein the VDD solder trace is disposed in a channel in the patterned mask.

In Example 9, the subject matter of any one or more of Examples 1-8 optionally include wherein the VSS trace is a first VSS trace, the solder trace is a first VSS solder trace, further including: a voltage drain drain (VDD) trace disposed between two VDD bond pads; a VDD solder trace disposed on the VDD trace and lineally superposed on the VDD trace; a subsequent VSS trace disposed on the upper surface and between two VSS bond pads, wherein the first VSS trace and the subsequent VSS trace are spaced apart by the VDD trace; a subsequent VSS solder trace disposed on the subsequent VSS trace and lineally superposed on the subsequent VSS trace; a first signal (signal-1) trace disposed between the first VSS trace and the VDD trace; and a second signal (signal-2) trace disposed between the VDD trace and the subsequent VSS trace.

In Example 10, the subject matter of Example 9 optionally includes a patterned mask disposed on the substrate upper surface, wherein the patterned mask is in lineal contact with each of the signal-1 trace and with the signal-2 trace.

In Example 11, the subject matter of any one or more of Examples 1-10 optionally include wherein the substrate is a semiconductive die.

In Example 12, the subject matter of any one or more of Examples 1-11 optionally include wherein the substrate is a semiconductive die package.

In Example 13, the subject matter of any one or more of Examples 1-12 optionally include wherein the substrate is a printed wiring board.

Example 14 is a method of assembling a power mesh-on-die apparatus comprising: patterning a power trace with at least two bond pads on a substrate; patterning a ground trace with at least two bond pads on the substrate; patterning a signal trace with bond pads on the substrate; patterning a mask to expose the bond pads; patterning the mask to open a channel to expose the power trace; and depositing a solder trace in the channel and on the exposed power trace.

In Example 15, the subject matter of Example 14 optionally includes wherein depositing a solder trace is achieved by wicking solder onto the power trace from adjacent solder bumps disposed on the at least two bond pads.

In Example 16, the subject matter of any one or more of Examples 14-15 optionally include depositing solder-bump precursors on the several bond pads; and reflowing the solder trace in the channel and the solder-bump precursors to form an integral structure to the two solder bumps and the solder trace.

In Example 17, the subject matter of any one or more of Examples 14-16 optionally include forming a trace infarction on the power trace.

In Example 18, the subject matter of any one or more of Examples 14-17 optionally include patterning the mask to open a channel to expose the ground trace; depositing solder trace in the channel and on the exposed ground trace; and wherein patterning the mask leaves the signal trace covered by the mask.

In Example 19, the subject matter of any one or more of Examples 14-18 optionally include depositing solder-bump precursors on the several bond pads; reflowing the solder trace in the channel and the solder-bump precursors to form a structure integral to the two solder bumps and the solder trace; and reflowing the solder trace in the channel exposing the ground trace and two solder-bump precursors to form a structure integral to the two solder bumps and the ground solder trace.

In Example 20, the subject matter of any one or more of Examples 14-19 optionally include wherein the power trace is a first power trace; further including: patterning a subsequent power trace between two bond pads; patterning the mask to open a channel to expose the subsequent power trace; and depositing a subsequent solder trace in the channel and on the exposed subsequent power trace.

In Example 21, the subject matter of any one or more of Examples 14-20 optionally include trace, further including: patterning a signal-2 trace on the substrate; and wherein patterning the mask leaves the signal-2 trace covered by the mask.

Example 22 is a computing system containing a power mesh-on-die apparatus, comprising: a substrate including an upper surface; a first voltage source source (VSS) trace disposed on the upper surface and between two first VSS bond pads; a first VSS solder trace disposed between the two first VSS bond pads and lineally superposed on the first VSS trace; a subsequent VSS trace disposed on the upper surface and between two subsequent VSS bond pads; a subsequent VSS solder trace disposed between the two subsequent VSS bond pads and lineally superposed on the subsequent VSS trace; a voltage drain drain (VDD) trace disposed between two VDD bond pads; a VDD solder trace disposed on the VDD trace and lineally superposed on the VDD trace; a patterned mask disposed on the substrate upper surface, wherein each VSS solder trace is disposed in a channel in the patterned mask; and an external shell disposed distant from the upper surface.

In Example 23, the subject matter of Example 22 optionally includes wherein each of the two VSS bond pads support a VSS solder bump, and wherein the first VSS solder trace and the two VSS solder bumps are an integral solder structure.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A power mesh-on-die apparatus comprising:
a substrate including an upper surface;
a voltage source source (VSS) trace disposed on the upper surface and between two VSS bond pads;
a VSS solder trace disposed between the two VSS bond pads and lineally superposed on the VSS trace;

a patterned mask disposed on the substrate upper surface, wherein the VSS solder trace is disposed in a channel in the patterned mask;

a subsequent VSS trace disposed on the upper surface and between two VSS bond pads; and a subsequent VSS solder trace disposed on the subsequent VSS trace and lineally superposed on the first VSS trace.

2. The power mesh-on-die apparatus of claim 1, further including:

a patterned mask disposed on the substrate upper surface, wherein the VSS solder trace is a first VSS solder trace disposed in a channel in the patterned mask; and wherein the subsequent VSS solder trace is disposed in a subsequent channel in the patterned mask.

3. The power mesh-on-die apparatus of claim 1, wherein each of the two VSS bond pads support a VSS solder bump, and wherein the VSS solder trace and the two VSS solder bumps are an integral solder structure.

4. The power mesh-on-die apparatus of claim 1 wherein the substrate is a semiconductive die package.

5. The power mesh-on-die apparatus of claim 1 wherein the substrate is a semiconductive die.

6. The power mesh-on-die apparatus of claim 1 wherein the substrate is a printed wiring hoard.

7. The power mesh-on-die apparatus of claim 1, further including an infarction in the VSS trace.

8. The power mesh-on-die apparatus of claim 1, wherein the VSS trace is a first VSS trace, the solder trace is a first VSS solder trace, further including:

a voltage drain drain (VDD) trace disposed between two VDD bond pads;

a VDD solder trace disposed on the VDD trace and lineally superposed on the VDD trace;

a subsequent VSS trace disposed on the upper surface and between two VSS bond pads, wherein the first VSS trace and the subsequent VSS trace are spaced apart by the VDD trace;

a subsequent VSS solder trace disposed on the subsequent VSS trace and lineally superposed on the subsequent VSS trace;

a first signal (signal-1) trace disposed between the first VSS trace and the VDD trace; and a second signal (signal-2) trace disposed between the VDD trace and the subsequent VSS trace.

9. The power mesh-on-die apparatus of claim 8, further including:

a patterned mask disposed on the substrate upper surface, wherein the patterned mask is in lineal contact with each of the signal-1 trace and with the signal-2 trace.

10. The power mesh-on-die apparatus of claim 1, wherein the VSS trace is a first VSS trace, the solder trace is a first VSS solder trace, further including:

a voltage drain drain (VDD) trace disposed between two VDD bond pads;

a VDD solder trace disposed on the VDD trace and lineally superposed on the VDD trace;

a subsequent VSS trace disposed on the upper surface and between two VSS bond pads, wherein the first VSS trace and the subsequent VSS trace are spaced apart by the VDD trace; and a subsequent VSS solder trace disposed on the subsequent VSS trace and lineally superposed on the subsequent VSS trace.

11. The power mesh-on-die apparatus of claim 10, further including:

a patterned mask disposed on the substrate upper surface, wherein the VSS solder trace is a first VSS solder trace disposed in a first channel in the patterned mask;

wherein the subsequent VSS solder trace is disposed in a subsequent channel in the patterned mask; and wherein the VDD solder trace is disposed in a channel in the patterned mask.

12. A power mesh-on-die apparatus comprising:

a substrate including an upper surface;

a first voltage source source (VSS) trace disposed on the upper surface and between two VSS bond pads;

a first VSS solder trace disposed between the two VSS bond pads and lineally superposed on the first VSS trace, wherein each of the two VSS bond pads support a VSS solder bump, and wherein the first VSS solder trace and the two VSS solder bumps are an integral solder structure;

a patterned mask disposed on the substrate upper surface, wherein the first VSS solder trace is disposed in a channel in the patterned mask;

an infarction in the VSS first trace;

a subsequent VSS trace disposed on the upper surface and between two VSS bond pads;

a subsequent VSS solder trace disposed on the subsequent VSS trace and lineally superposed on the first VSS trace.

13. The power mesh-on-die apparatus of claim 12 wherein the substrate is selected from the group consisting of a semiconductive die, a semiconductive die package and a printed wiring board.

14. The power mesh-on-die apparatus of claim 12, wherein the infarction is a first infarction, further including a second infarction in the VSS first trace.

15. The power mesh-on-die apparatus of claim 12, wherein the subsequent VSS solder trace is disposed in a subsequent channel in the patterned mask.

16. The power mesh-on-die apparatus of claim 12, further including:

a voltage drain drain (VDD) trace disposed between two VDD bond pads;

a VDD solder trace disposed on the VDD trace and lineally superposed on the VDD trace;

a first signal (signal-1) trace disposed between the first VSS trace and the VDD trace; and a second signal (signal-2) trace disposed between the VDD trace and the subsequent VSS trace.

17. The power mesh-on-die apparatus of claim 16, wherein the patterned mask is in lineal contact with each of the signal-1 trace and with the signal-2 trace.

18. The power mesh-on-die apparatus of claim 12, further including:

a voltage drain drain (VDD) trace disposed between two VDD bond pads; and a VDD solder trace disposed on the VDD trace and lineally superposed on the VDD trace.

19. The power mesh-on-die apparatus of claim 18, wherein the subsequent VSS solder trace is disposed in a subsequent channel in the patterned mask; and wherein the VDD solder trace is disposed in a channel in the patterned mask.

20. A computing system containing a power mesh-on-die apparatus, comprising:

a substrate including an upper surface;

a first voltage source source (VSS) trace disposed on the upper surface and between two first VSS bond pads;

a first VSS solder trace disposed between the two first VSS bond pads and lineally superposed on the first VSS trace;

a subsequent VSS trace disposed on the upper surface and between two subsequent VSS bond pads;

a subsequent VSS solder trace disposed between the two subsequent VSS bond pads and lineally superposed on the subsequent VSS trace;

a voltage drain drain (VDD) trace disposed between two VDD bond pads;

a VDD solder trace disposed on the VDD trace and lineally superposed on the VDD trace;

a patterned mask disposed on the substrate upper surface, wherein each VSS solder trace is disposed in a channel in the patterned mask; and an external shell disposed distant from the upper surface.

21. The power mesh-on-die apparatus of claim 20, wherein each of the two VSS bond pads support a VSS solder bump, and wherein the first VSS solder trace and the two VSS solder bumps are an integral solder structure.

* * * * *